United States Patent
Roelle et al.

(10) Patent No.: US 11,183,724 B2
(45) Date of Patent: Nov. 23, 2021

(54) ELECTROCHEMICAL CELL CONNECTOR HAVING FLEXIBLE CIRCUIT INCLUDING PLURALITY OF ARMS WITH CONDUCTOR IN OPENING OF ARMS AND BATTERY PACK CONTAINING SAME

(71) Applicant: TC1 LLC, Pleasanton, CA (US)

(72) Inventors: Dustin Roelle, Mountain House, CA (US); Jesse Gage, Pleasanton, CA (US); Gregory Ray, Pleasanton, CA (US); Ethan Petersen, Pleasanton, CA (US); Jaime Romero, Pleasanton, CA (US)

(73) Assignee: TC1 LLC, St. Paul, MN (US)

( * ) Notice: Subject to any disclaimer, the term of this patent is extended or adjusted under 35 U.S.C. 154(b) by 158 days.

(21) Appl. No.: 16/455,962

(22) Filed: Jun. 28, 2019

(65) Prior Publication Data

US 2020/0006720 A1 Jan. 2, 2020

Related U.S. Application Data

(60) Provisional application No. 62/692,046, filed on Jun. 29, 2018.

(51) Int. Cl.
*H01M 50/172* (2021.01)
*H01M 10/04* (2006.01)
(Continued)

(52) U.S. Cl.
CPC ..... *H01M 50/172* (2021.01); *H01M 10/0422* (2013.01); *H01M 50/20* (2021.01);
(Continued)

(58) Field of Classification Search
CPC ............. H01M 50/172; H01M 50/502; H01M 50/543; H01M 50/20; H01M 10/0422; H05K 3/328; H05K 3/363
(Continued)

(56) References Cited

U.S. PATENT DOCUMENTS 5,472,804 A 12/1995 Austin et al.
5,761,792 A * 6/1998 Alexandres ............ H05K 3/328
29/623.3
(Continued)

FOREIGN PATENT DOCUMENTS

EP 0571236 A1 11/1993

OTHER PUBLICATIONS

European Search Report issued in corresponding EP Patent Application No. 19183253 dated Nov. 14, 2019, 5 pages.

*Primary Examiner* — Sean P Cullen
(74) *Attorney, Agent, or Firm* — Armstrong Teasdale LLP

(57) ABSTRACT

The present disclosure is directed to an electrochemical cell connector for electrically connecting a plurality of electrochemical cells, and to battery packs including the electrochemical cell connector. The electrochemical cell connectors of the present disclosure are fabricated from a flexible circuit. The flexible circuit includes conductors, such as nickel conductors, soldered or otherwise attached thereto via holes or openings in the flexible circuit. These conductors may be welded or otherwise attached to an electrochemical cell, and the electrochemical cell connections made on the flexible circuit. In many embodiments, the conductors may be attached to the flexible circuit using industry standard automated assembly equipment thus streamlining the manufacturing process and improving overall quality of the product.

20 Claims, 4 Drawing Sheets

(51) Int. Cl.
*H05K 3/32* (2006.01)
*H05K 3/36* (2006.01)
*H01M 50/20* (2021.01)
*H01M 50/502* (2021.01)
*H01M 50/543* (2021.01)

(52) U.S. Cl.
CPC ....... *H01M 50/502* (2021.01); *H01M 50/543* (2021.01); *H05K 3/328* (2013.01); *H05K 3/363* (2013.01)

(58) Field of Classification Search
USPC .............................. 429/156, 158, 160, 178
See application file for complete search history.

(56) References Cited

U.S. PATENT DOCUMENTS

| | | | |
|---|---|---|---|
| 9,985,266 B1 | 5/2018 | Potter et al. | |
| 2004/0197642 A1* | 10/2004 | Sato | H01M 50/543 429/158 |
| 2005/0110458 A1* | 5/2005 | Seman, Jr. | H01M 10/425 320/114 |
| 2012/0031645 A1 | 2/2012 | Tartaglia | |

* cited by examiner

ELECTROCHEMICAL CELL CONNECTOR HAVING FLEXIBLE CIRCUIT INCLUDING PLURALITY OF ARMS WITH CONDUCTOR IN OPENING OF ARMS AND BATTERY PACK CONTAINING SAME

CROSS REFERENCE TO RELATED APPLICATIONS

This application claims priority to provisional application Ser. No. 62/692,046, filed Jun. 29, 2018, which is incorporated herein in its entirety.

BACKGROUND OF THE DISCLOSURE

Field of the Disclosure

The present disclosure generally relates to a means for electrically connecting two or more electrochemical cells. In particular, the present disclosure relates to an electrochemical cell connector fabricated from a flexible circuit and to battery packs containing the electrochemical cell connector. Methods of manufacturing and using the electrochemical cell connector and battery packs are also disclosed.

Background Art

A wide variety of consumer products and medical devices utilize primary and/or secondary electrochemical cells to provide power to the product or device. In many cases, battery packs, which include two or more electrochemical cells coupled together for use, are used to provide prolonged power and/or voltage as compared to a single electrochemical cell. Such battery packs may be used in many types of desirable medical devices including, for example, left ventricular assist devices and right ventricular assist devices, which may require higher sustained power draws as compared to other medical devices as they generally operate continuously for longer periods of time.

In many instances, it is common practice in the industry to electrically connect electrochemical cells and battery packs by welding nickel conductors (or another electrically conductive metal) directly to the electrochemical cell and then solder and/or weld the welded conductors directly to the electrical system. In many cases, the secondary solder/weld process described may expose the electrochemical cells to elevated temperatures which, in some cases, may not be desirable. Additionally, this process may include hand labor, which can be expensive and time consuming and be potentially challenging from a quality control standpoint.

SUMMARY OF THE DISCLOSURE

The present disclosure is directed to an electrochemical cell connector for electrically connecting a plurality of electrochemical cells. The electrochemical connector comprises: (i) a flexible circuit including a plurality of arms sized and configured to bend and attach to the plurality of electrochemical cells, wherein each of the plurality of arms includes at least one opening therein; and (2) a conductor located in the at least one opening in each of the plurality of arms, wherein the conductor is sized and configured for attachment to the plurality of electrochemical cells.

The present disclosure is further directed to a battery pack. The battery pack comprises: (i) an electrochemical cell connector comprising a flexible circuit, the flexible circuit including a plurality of arms sized and configured to bend and attach to a plurality of electrochemical cells, wherein each of the plurality of arms includes openings therein that each have disposed therein a conductor for attaching to a positive terminal or a negative terminal on the plurality of electrochemical cells; and (ii) a plurality of electrochemical cells disposed in the electrochemical cell connector, wherein the plurality of electrochemical cells are attached to the plurality of arms via the conductors disposed in the openings.

The present disclosure is further directed to a battery pack including four cylindrical electrochemical cells. The battery pack comprises: (i) an electrochemical cell connector comprising a flexible circuit, the flexible circuit including five arms sized and configured to bend and attach to the four cylindrical electrochemical cells, wherein each of the five arms includes openings therein that each have disposed therein a conductor for attaching to a positive terminal or a negative terminal on the four cylindrical electrochemical cells; and (ii) four cylindrical electrochemical cells disposed in the electrochemical cell connector, wherein the four cylindrical electrochemical cells are attached to the five arms via the conductors disposed in the openings.

The foregoing and other aspects, features, details, utilities, and advantages of the present disclosure will be apparent from reading the following description and claims, and from reviewing the accompanying drawings.

DETAILED DESCRIPTION OF THE DISCLOSURE

Figure 1:
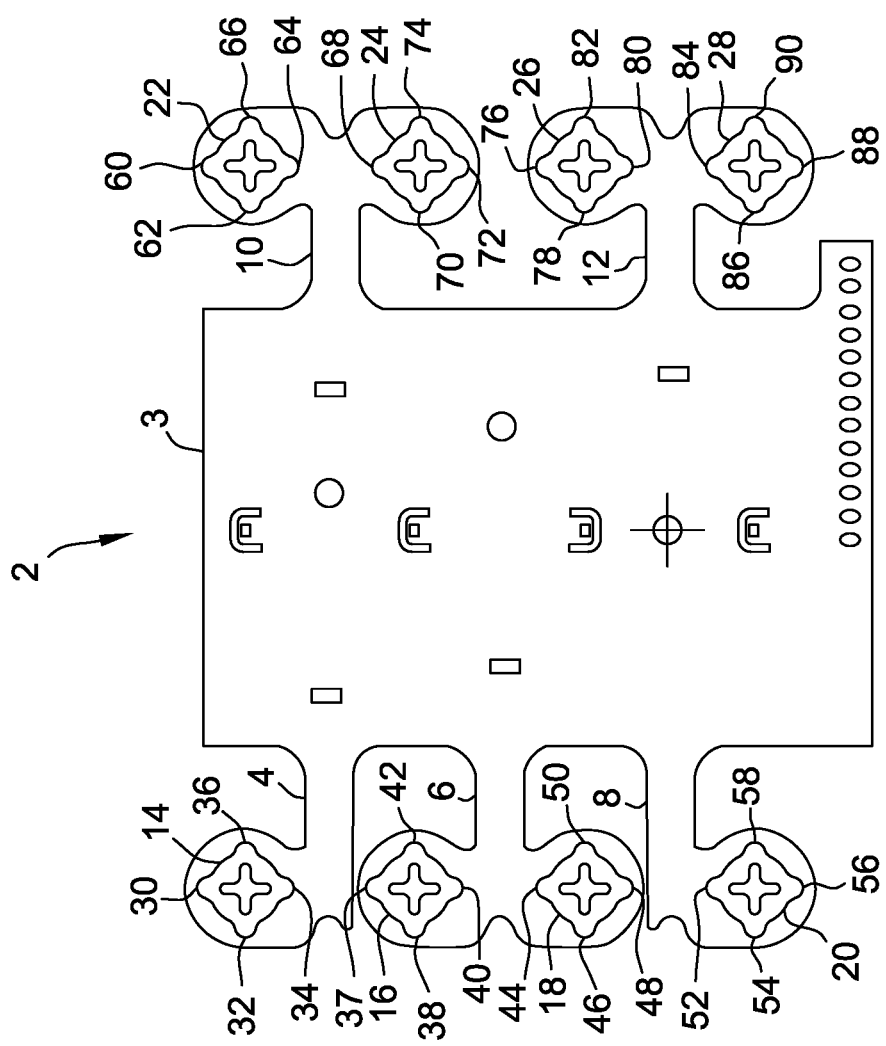
FIG. 1 is a top down view of a flexible circuit including multiple connectors in accordance with one embodiment of the present disclosure.

The fabrication of battery packs including two or more electrically connected electrochemical cells (batteries) has, to date, been time consuming and laborious. Many previous methods used to electrically connect electrochemical cells in battery packs have included welding nickel conductors to electrochemical cells and then soldering or welding those conductors to the rest of the electrical system. Other methodologies employed have also met with less than desirable results in some cases. As such, it would be desirable to provide a battery pack including a plurality of electrically connected electrochemical cells that can be fabricated quickly, efficiently and with controlled and reproducible results.

The present disclosure is directed to an electrochemical cell connector for electrically connecting a plurality of electrochemical cells, and to battery packs including the electrochemical cell connector. The electrochemical cell connectors of the present disclosure are fabricated from a flexible circuit (sometimes referred to as a "flex circuit"). The flexible circuit includes conductors, such as nickel conductors, soldered or otherwise attached thereto via holes or openings in the flexible circuit. These conductors may be welded or otherwise attached to an electrochemical cell as described herein, and the electrochemical cell series connections are made on the flexible circuit, thus minimizing the high resistance path through the connector. In many embodiments, the conductors may be attached to the flexible circuit using industry standard automated assembly equipment thus streamlining the manufacturing process and improving overall quality and reliability of the product. The use of a flexible circuit in the electrochemical cell connector as described herein increases durability for shock and vibrations, and stress to any solder joint and/or weld joints is also minimized resulting in improved performance.

In many embodiments of the present disclosure, the conductors present in the electrochemical cell connector will include a "keep out zone" that prevents the welding (or otherwise affixing) of the conductor to a sensitive area on the electrochemical cell; that is, in many embodiments, the conductors will include a specific area or zone thereon where welding does not, and cannot, occur and thus any potential for damage to the sensitive areas on the electrochemical cell during the manufacturing of a battery pack is eliminated.

By mounting the conductors in a hole or opening in the flexible circuit, many advantages can be obtained including, for example, allowing electrochemical cell welding to occur through the flexible circuit using defined weld locations. Additionally, the conductor can be self-centered (that is, properly oriented) in the desired position on the flexible circuit during manufacturing. Furthermore, the conductor allows the hole or opening in the flexible circuit to be large enough to provide increased access and clearance during manufacturing and allows for increased strength of the solder joint joining the conductor to the flexible circuit. In many embodiments, the conductors may be put into a tape and reel for automated pick and placement during the manufacturing process, thus increasing efficiency and reducing build times and complexity.

The flexible circuit used to construct the electrochemical cell connector includes one or more arms that bend in a predetermined manner and direction to attach to the electrochemical cells, as further described herein. These arms may be sized, configured, and constructed to conform to various electrochemical cell or battery pack geometries including, for example, cylindrical cells, prismatic cells, pouch-type cells, and button-type cells. The flexible circuits as described herein may include one, two, three four, five, six, seven eight, nine, ten or even more arms that may bend or flex in any predetermined manner or configuration so as to secure to two or more electrochemical cells and form a battery pack. Additionally, the flexible circuit eliminates the need for any wired connection between circuitry and electrochemical cells, and allows for integrated electrochemical cell temperature sensors and cell voltage management sensors while optimizing volumetric efficiency.

Flexible circuits suitable for use in the present disclosure for fabricating the electrochemical cell connectors and battery packs described herein may be constructed primarily of a flexible plastic substrate formed from polyimides, polyether ketones, transparent conductive polyesters films, and combinations thereof. Other suitable materials may also be used for the construction of the flexible circuit. In some embodiments, the flexible circuit may include a thin insulating polymer film or films having one or more conductive circuit patterns affixed thereto and further optionally including a thin polymer coating to protect the conductor circuits. More than one polymer coating may also be utilized in some embodiments. Suitable flexible circuits may additionally include one metal layer flexible circuits, double sided flexible circuits, multilayer flexible circuits, and rigid flexible circuits. In many embodiments, the flexible circuit may be formed by etching metal foil cladding (normally constructed of copper, although other materials may also be suitable) from polymer bases, plating metal or printing of conductive inks. In some embodiments, the flexible circuit may have one or more additional electronic or non-electronic components attached thereto. In accordance with the present disclosure, the flexible circuit may be a one piece design, or a multiple piece design.

Referring now to FIG. 1, there is shown a top down view of a flexible circuit 2 in accordance with one embodiment of the present disclosure. Although many of the embodiments of the present disclosure describe flexible circuits sized and configured for holding four cylindrical shaped electrochemical cells (such as four 18650 cylindrical cells and the like), one skilled in the art based on the disclosure herein will recognize that the flexible circuits could be sized and configured to hold two, three, four, five, six, seven, eight, nine, ten or more cylindrical or other shaped primary or secondary electrochemical cells.

Referring again to FIG. 1, flexible circuit 2 includes substrate 3 and bendable arms 4, 6, 8, 10, and 12. As shown in FIG. 1, bendable arms 4, 6, 8, 10, and 12 extend from a planar portion of substrate 3. Bendable arms 4, 6, 8, 10, and 12 include conductors 14, 16, 18, 20, 22, 24, 26, and 28, respectively. Conductors 14, 16, 18, 20, 22, 24, 26, and 28 are sized and configured to fit into holes or openings (not shown in FIG. 1) in bendable arms 4, 6, 8, 10, and 12 of flexible circuit 2. Conductor 14 includes tabs 30, 32, 34, and 36; conductor 16 includes tabs 37, 38, 40, and 42; conductor 18 includes tabs 44, 46, 48, and 50; conductor 20 includes tabs 52, 54, 56, and 58; conductor 22 includes tabs 60, 62, 64, and 66; conductor 24 includes tabs 68, 70, 72, and 74; conductor 26 includes tabs 76, 78, 80, and 82; and conductor 28 includes tabs 84, 86, 88, and 90.

Figure 2:
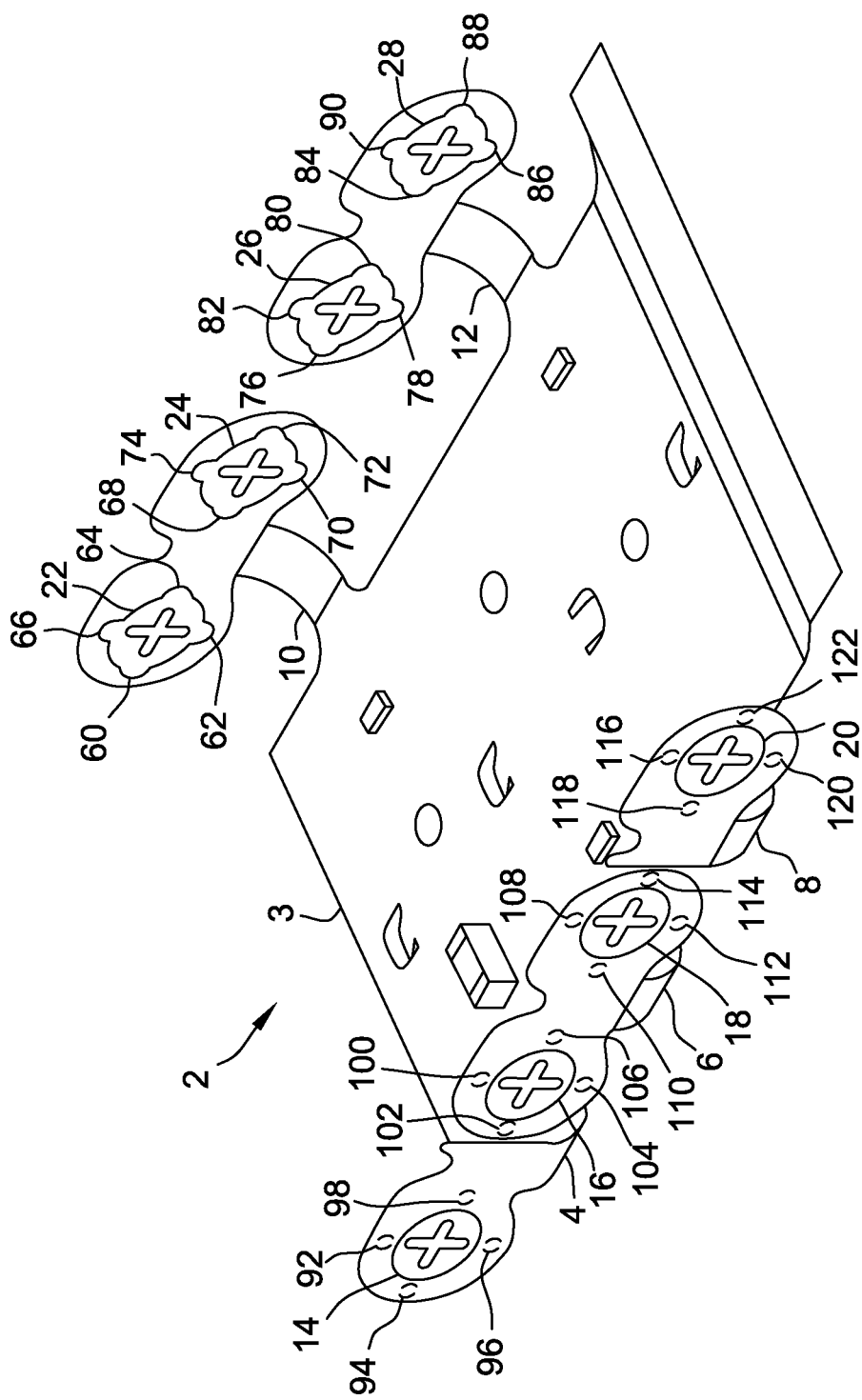
FIG. 2 is top/side view of the flexible circuit of FIG. 1.

Each of conductors 14, 16, 18, 20, 22, 24, 26, and 28 are soldered or otherwise affixed to substrate 3 of flexible circuit 2. In the illustrated embodiment of FIG. 1, each of the conductors is soldered to substrate 3 at four points on the conductor that correspond to the four tabs on each conductor; that is, each conductor is secured to substrate 3 via four solder joints that correspond to the four tabs on each conductor. Referring now to FIG. 2, there is shown a top/side view of flexible circuit 2 that includes substrate 3. In FIG. 2, bendable arms 4, 6, 8, 10, and 12 are bent upwards and hence positioned to receive cylindrical shaped electrochemical cells (not shown in FIG. 2). Further illustrated in FIG. 2 are conductors 14, 16, 18, 20, 22, 24, 26, and 28. Tabs 60, 62, 64, and 66 are shown on conductor 22; tabs 68, 70, 72, and 74 are shown on conductor 24, tabs 76, 78, 80, and 82 are shown on conductor 26; and tabs 84, 86, 88, and 90 are shown on conductor 28. Also shown in FIG. 2 are solder joints 92, 94, 96, and 98 that attach conductor 14 to substrate 3; solder joints 100, 102, 104, and 106 that attach conductor 16 to substrate 3; solder joints 108, 110, 112, and 114 that attach conductor 18 to substrate 3; and solder joints 116, 118, 120, and 122 that attach conductor 20 to substrate 3. These solder joints secure each conductor to the substrate (on each respective bendable arm) and hence to the flexible circuit are located at each of the four tabs of each conductor as described above; that is, each conductor is secured to the substrate at four soldered positions that correspond to each of the four tabs present on each conductor. Attachment methods other than soldering may be suitable in some embodiments.

Figure 3:
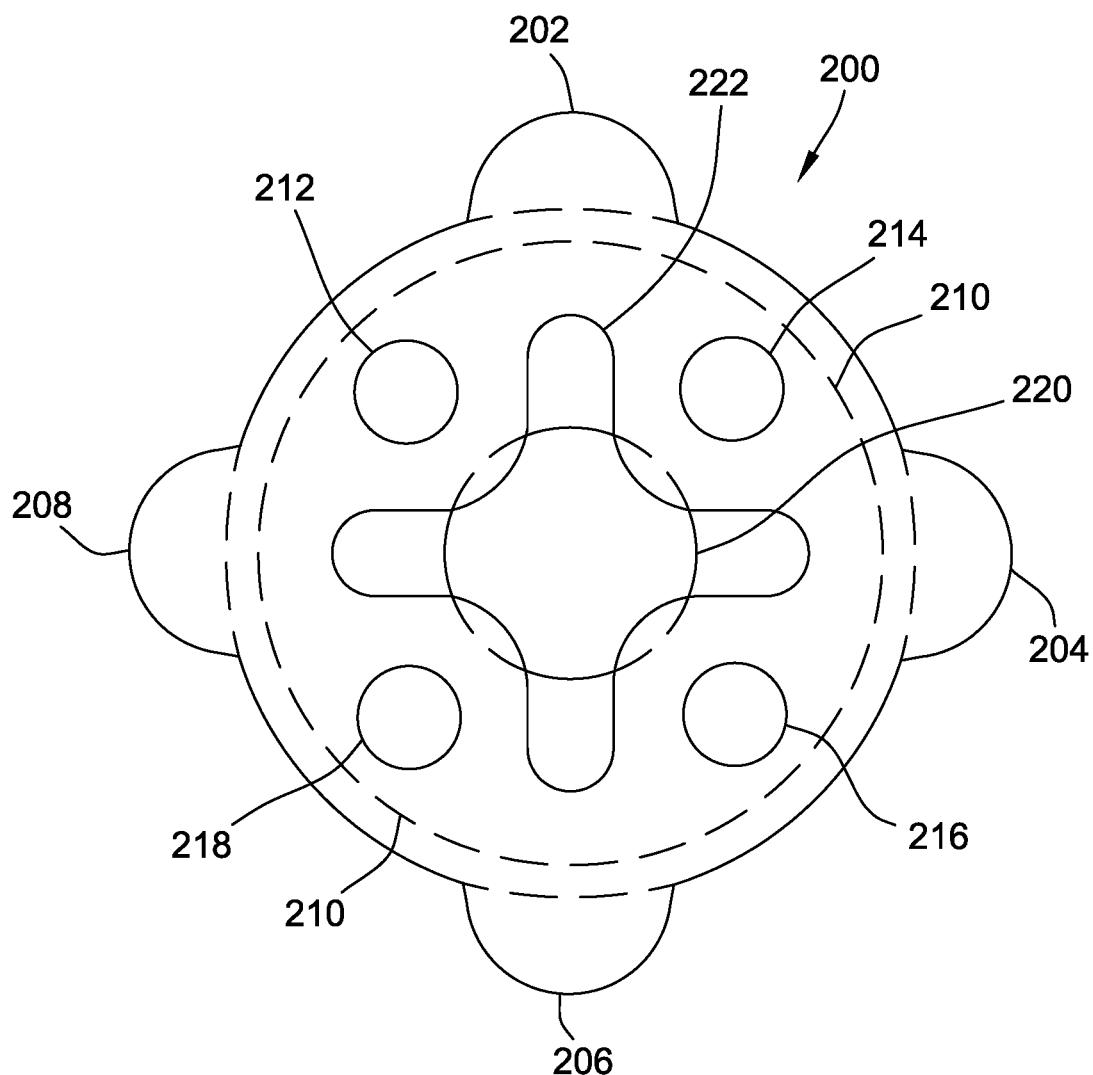
FIG. 3 is a top view of a connector suitable for use with the flexible circuit of FIGS. 1 and 2.

Referring now to FIG. 3, there is shown a top down view of conductor 200 suitable for use in the electrochemical cell connectors of the present disclosure described herein. Conductor 200, which may be inserted into holes or openings in the flexible circuit as described, may be fabricated from any electrically conductive material suitable for welding or otherwise affixing to an electrochemical cell, and specifically to the positive and negative terminal of an electrochemical cell. In many embodiments, conductor 200 is formed from nickel or from a nickel alloy, although other metals or metal alloys may also be suitable. Conductor 200 includes tabs 202, 204, 206, and 208, which allow for precise control of the orientation of the conductor on the flexible circuit (not shown in FIG. 3 but see FIGS. 1 and 2) when inserted into holes or openings on the flexible circuit as described herein. Tabs 202, 204, 206, and 208 are soldered or otherwise affixed to the flexible circuit as described herein. In some embodiments, the conductor may be supplied pre-loaded with solder in the desired area of each of the four tabs to simplify the soldering process. Conductor 200 is designed so that any welding (or otherwise affixing) of conductor 200 to an electrochemical cell (not shown in FIG. 3) occurs within a desired zone on conductor 200 illustrated in FIG. 3 as circle 210. Within circle 210 are weld nuggets 212, 214, 216, and 218, which connect conductor 200 at four distinct points to an electrochemical cell. By locating weld nuggets 212, 214, 216, and 218 at these locations, conductor 200 provides a keep out zone 220 on conductor 200. Keep out zone 220 is the area of conductor 200 where welding to an electrochemical cell cannot occur; that is, no welding of conductor 200 to an electrochemical cell will occur in keep out zone 220. By allowing keep out zone 220 to be weld-free, the sensitive area of the electrochemical cell, which may include various safety mechanisms, such as safety vents and the like, remain undamaged from the manufacturing process and able to provide their intended function. Conductor 200 also includes cross-shaped opening 222 that allows access to an electrochemical cell terminal (not shown in FIG. 3) through conductor 200. Although illustrated in FIG. 3 as a cross-shape, cross-shaped opening 222 could take any desired shape to allow access to an electrochemical cell terminal, as will be recognized by one skilled in the art based on the disclosure herein. Further, it will be recognized by one skilled in the art based on the disclosure herein that the size of keep out zone 220 may be controlled and enlarged or reduced accordingly by controlling the size of weld nuggets 212, 214, 216, and 218.

Conductor 200 may be sized and configured for application to any of a number of battery sizes and types in accordance with embodiments of the present disclosure. Although conductor 200 is generally illustrated and described herein as having four tabs (or ears) for locating/orienting the conductor onto the flexible circuit during manufacturing, one skilled in the art based on the disclosure herein will recognize that conductors could be designed and configured to include more or less tabs in accordance with the general teachings herein and still achieve their desired purpose. More or less tabs may be utilized on the conductors depending upon the size and type of the electrochemical cell being utilized and the desired application. The width and length dimensions along with the number of tabs of the conductor may be chosen based upon the specific application desired. Any suitable thickness may be employed as desired for the conductor, although in some embodiments a suitable thickness for the conductor (such as a nickel conductor) may be between about 1 and about 10 thousandths of an inch, including about 6 thousandths of an inch. Such thicknesses provide the desired properties for the conductor and allow for suitable welds to be made to the electrochemical cells.

Figure 4:
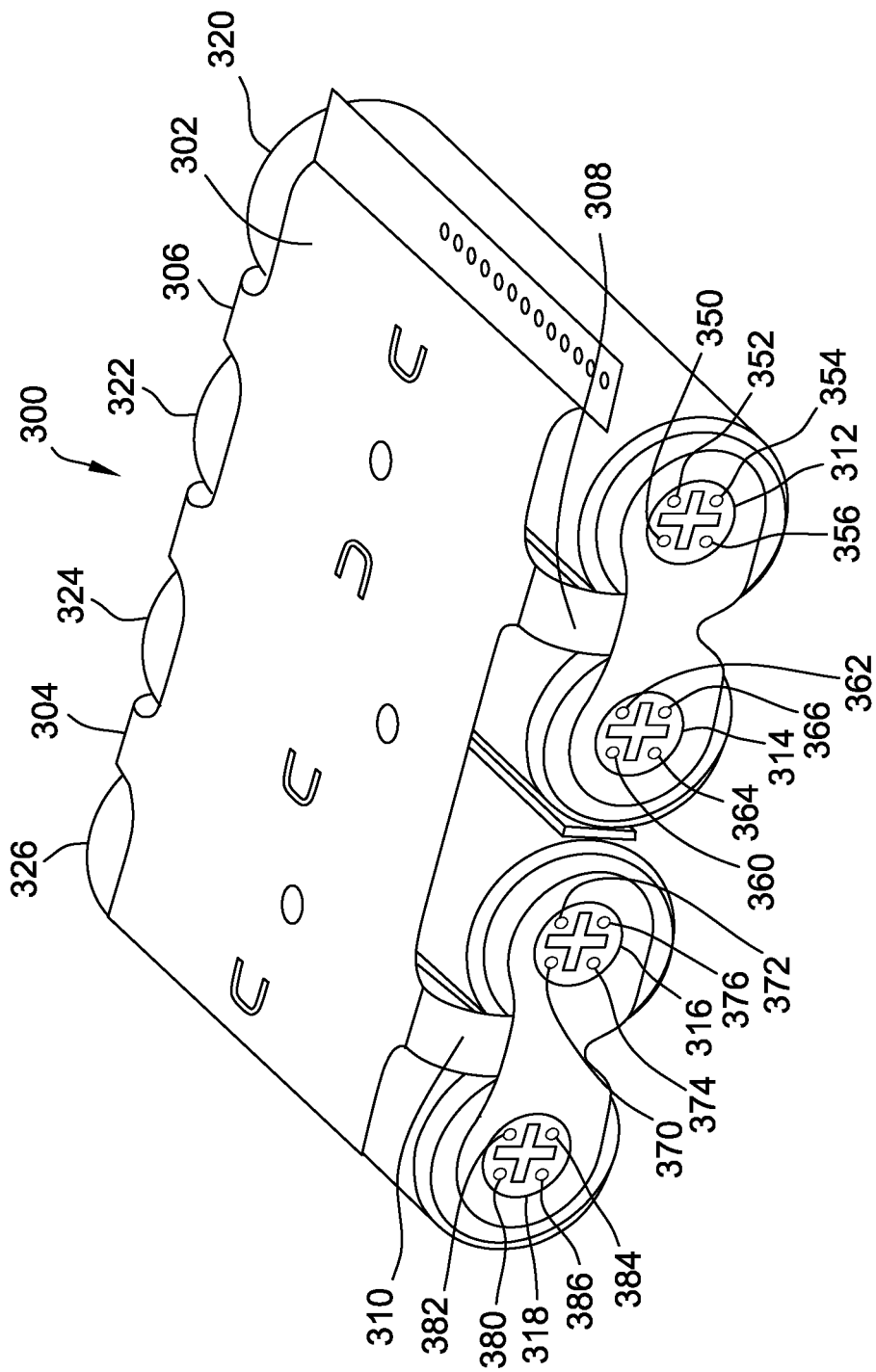
FIG. 4 is a battery pack incorporating the flexible circuit of FIGS. 1 and 2.

Referring now to FIG. 4, there is shown battery pack 300. Battery pack 300 includes flexible circuit 302 including bendable arms 304, 306, 308, and 310. As shown in FIG. 4, bendable arm 308 includes conductors 312 and 314 and bendable arm 310 includes conductors 316 and 318. Battery pack 300 additionally includes electrochemical cells 320, 322, 324, and 326, which are held in place in battery pack 300 by bendable arms 304, 306, 308, and 310. Conductor 312 is welded to electrochemical cell 320 at weld nuggets 350, 352, 354, and 356; conductor 314 is welded to electrochemical cell 322 at weld nuggets 360, 362, 364, and 366; conductor 316 is welded to electrochemical cell 324 at weld nuggets 370, 372, 374, and 376; and conductor 318 is welded to electrochemical cell 326 at weld nuggets 380, 382, 384, and 386.

The battery packs of the present disclosure that include the flexible circuit may include two, three, four, five, six, seven, eight, nine, ten or more primary or secondary (rechargeable) electrochemical cells and may be fabricated by any suitable method using the flexible circuit as described herein. In many suitable embodiments, the connectors as described herein may be soldered or otherwise affixed to the flexible circuit as described herein by hand or by using automated assembly equipment. The use of automated assembly equipment may in some embodiments improve the overall quality and reliability of the finished battery pack, and may reduce construction time. Once the connectors are introduced and affixed onto the flexible circuit at the desired locations, the bendable arms of the flexible circuit, including the conductors thereon, are shaped as desired and electrochemical cells are introduced into the bent arms in the desired configuration. After the positioning of the electrochemical cells is completed, each conductor is welded, or otherwise affixed, to the electrochemical cells as described herein. In many embodiments, the electrochemical cells may be cylindrical electrochemical cells (such as an 18650 electrochemical cell or the like) that have one conductor welded to a positive terminal and one conductor welded to a negative terminal. Other battery sizes and types are also within the scope of the present disclosure and may be suitably used with the flexible circuits and electrochemical cell connectors as described herein.

The battery packs of the present disclosure that include the electrochemical cell connector including the flexible circuit and conductors as described herein are suitable for use in a wide variety of consumer and commercial electronics devices that require one or more power sources. In some embodiments, the battery packs may be particularly useful for medical devices requiring one or more power sources. In one specific embodiment, battery packs including the flexible circuit may be particularly desirable for use with a left ventricular assist device or right ventricular assist device. Left and right ventricular assist devices run continuously and may, in some embodiments, require a relatively large voltage draw of 5 to 10 Watts from a power source; in such cases, battery packs that include multiple electrochemical cells may be particularly desirable power sources.

Although a number embodiments of this disclosure have been described above with a certain degree of particularity, those skilled in the art could make numerous alterations to the disclosed embodiments without departing from the spirit or scope of the disclosure. All directional references (e.g., upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of the disclosure. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the disclosure as defined in the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

What is claimed is:

1. An electrochemical cell connector for electrically connecting a plurality of electrochemical cells, the connector comprising:
    a flexible circuit including a plurality of arms sized and having the capability to bend and attach to the plurality of electrochemical cells, wherein each of the plurality of arms includes at least one opening therein, the plurality of arms including:
        a plurality of first arms extending from a first edge of a planar portion of the flexible circuit; and
        a plurality of second arms extending from a second edge of the planar portion of the flexible circuit, the first edge opposite the second edge, each of the first and second arms bendable to cause a first opening of the at least one opening in each first arm to align with a second opening of the at least one opening in a corresponding second arm of the plurality of second arms while the first and second openings are oriented perpendicular to the planar portion of the flexible circuit; and
    a conductor located in the at least one opening in each of the plurality of arms, wherein the conductor is sized and configured for attachment to the plurality of electrochemical cells.

2. The electrochemical cell connector of claim 1, wherein a number of the plurality of first arms is different than a number of the plurality of second arms.

3. The electrochemical cell connector of claim 1, wherein the flexible circuit is fabricated from a flexible plastic substrate.

4. The electrochemical cell connector of claim 3, wherein the flexible plastic substrate is selected from the group consisting of polyimides, polyether ketones, transparent conductive polyesters films, and combinations thereof.

5. The electrochemical cell connector of claim 1, wherein the conductor is fabricated from a material suitable for attachment to the plurality of electrochemical cells via welding.

6. The electrochemical cell connector of claim 5, wherein the material suitable for attachment to the plurality of electrochemical cells is nickel.

7. The electrochemical cell connector of claim 6, wherein the conductor is soldered onto the plurality of arms of the connector.

8. The electrochemical cell connector of claim 7, wherein the conductor includes a plurality of tabs thereon to control an orientation of the conductor on the plurality of arms of the connector.

9. The electrochemical cell connector of claim 8, wherein the conductor includes a keep out zone thereon.

10. The electrochemical cell connector of claim 8, wherein the conductor additionally includes from 1 to about 4 weld nuggets thereon.

11. A battery pack comprising:
    an electrochemical cell connector comprising a flexible circuit, the flexible circuit including a plurality of arms sized and having the capability to bend and attach to a plurality of electrochemical cells, wherein each of the plurality of arms includes at least one opening therein, a conductor disposed within the at least one opening for attaching to a positive terminal or a negative terminal on the plurality of electrochemical cells, the plurality of arms including:
        a plurality of first arms extending from a first edge of a planar portion of the flexible circuit; and
        a plurality of second arms extending from a second edge of the planar portion of the flexible circuit, the first edge opposite the second edge, each of the first and second arms bendable to cause a first opening of the at least one opening in each first arm to align with a second opening of the at least one opening in a corresponding second arm of the plurality of second arms while the first and second openings are oriented perpendicular to the planar portion of the flexible circuit; and
    the plurality of electrochemical cells disposed in the electrochemical cell connector, wherein the plurality of electrochemical cells are attached to the plurality of arms via the conductors disposed in the openings.

12. The battery pack of claim 11, wherein a number of the plurality of electrochemical cells disposed in the electrochemical cell connector is selected from the group consisting of two, three, four, five, six, seven and eight.

13. The battery pack of claim 11, wherein the plurality of electrochemical cells are cylindrical electrochemical cells having a diameter of about 18 millimeters and a length of about 65 millimeters.

14. The battery pack of claim 11, wherein the flexible circuit is fabricated from a flexible plastic substrate.

15. The battery pack of claim 14, wherein the flexible plastic substrate is selected from the group consisting of polyimides, polyether ketones, transparent conductive polyesters films, and combinations thereof.

16. The battery pack of claim 11, wherein the conductor is fabricated from a material suitable for welding to the electrochemical cells.

17. The battery pack of claim 16, wherein the material suitable for welding to the electrochemical cells is nickel.

18. The battery pack of claim 17, wherein the conductor is soldered onto the plurality of arms of the connector.

19. The battery pack of claim 18, wherein the conductor includes a plurality of tabs thereon to control an orientation of the conductor on the plurality of arms of the connector.

20. The battery pack of claim 19, wherein the conductor includes a keep out zone thereon.

\* \* \* \* \*